US007345798B2

(12) United States Patent
Kondo

(10) Patent No.: US 7,345,798 B2
(45) Date of Patent: Mar. 18, 2008

(54) METHOD OF AND APPARATUS FOR CORRECTING COLOR OF PRINT MEDIUM, AND PROOFER USED THEREIN

(75) Inventor: Hirokazu Kondo, Minamiashigara (JP)

(73) Assignee: FUJIFILM Corporation, Tokyo (JP)

( * ) Notice: Subject to any disclaimer, the term of this patent is extended or adjusted under 35 U.S.C. 154(b) by 673 days.

(21) Appl. No.: 09/851,164

(22) Filed: May 9, 2001

(65) Prior Publication Data

US 2001/0028471 A1 Oct. 11, 2001

Related U.S. Application Data

(63) Continuation-in-part of application No. 09/210,392, filed on Dec. 14, 1998, now abandoned.

(30) Foreign Application Priority Data

Dec. 15, 1997 (JP) .................................. 9-345012

(51) Int. Cl.
*G03F 3/08* (2006.01)
*H04N 1/00* (2006.01)

(52) U.S. Cl. ...................... 358/523; 358/500; 358/518; 358/521; 382/167

(58) Field of Classification Search ................. 358/1.9, 358/518–521, 527, 504, 505, 523, 500; 382/112, 382/167, 274; 345/589, 22, 593, 597, 82–88, 345/603, 604
See application file for complete search history.

(56) References Cited

U.S. PATENT DOCUMENTS 363,835 A * 5/1887 Lovibond .................. 356/419
4,866,514 A * 9/1989 Yeomans .................... 358/523
4,926,254 A * 5/1990 Nakatsuka et al. ......... 358/527
5,185,661 A * 2/1993 Ng ............................. 358/505
5,317,425 A * 5/1994 Spence et al. ............. 358/504
5,333,069 A 7/1994 Spence ....................... 358/517
5,477,345 A * 12/1995 Tse ............................ 358/500
5,481,380 A * 1/1996 Bestmann ................... 358/504

(Continued)

FOREIGN PATENT DOCUMENTS

JP 05-252392 9/1993

(Continued)

*Primary Examiner*—David Moore
*Assistant Examiner*—James A. Thompson
(74) *Attorney, Agent, or Firm*—Sughrue Mion, PLLC

(57) ABSTRACT

Even if the color of a print sheet to be actually used for printing is lighter than the color of a sheet according to a given standard printing profile, a printer outputs a proof on a dedicated sheet where the difference between the sheet colors has been corrected. Specifically, after input image data are converted to colorimetric data by a printing profile, the difference between the sheet colors is corrected by one-dimensional LUTs. Input/output gradients (straight lines) incorporated in the one-dimensional LUTs are represented by $X\alpha/X0$, $Y\alpha/Y0$, $Z\alpha/Z0$ where $X\alpha$, $Y\alpha$, $Z\alpha$ indicate colorimetric values of the color of the print sheet to be actually used for printing and X0, Y0, Z0 indicate colorimetric values of the color of a standard print sheet used to generate the print profile. The difference between the sheet color according to the standard printing profile and the sheet color to be actually used for printing thus becomes corrected.

41 Claims, 4 Drawing Sheets

U.S. PATENT DOCUMENTS

| | | | | | |
|---|---|---|---|---|---|
| 5,568,285 | A | | 10/1996 | Ikeda | 358/518 |
| 5,579,031 | A | * | 11/1996 | Liang | 345/604 |
| 5,596,510 | A | | 1/1997 | Boenke | 364/526 |
| 5,598,272 | A | * | 1/1997 | Fisch et al. | 358/1.9 |
| 5,604,567 | A | * | 2/1997 | Dundas et al. | 399/39 |
| 5,619,434 | A | * | 4/1997 | Keating | 703/6 |
| 5,677,967 | A | * | 10/1997 | Pariser | 382/167 |
| 5,687,000 | A | | 11/1997 | Nakaoka | 358/296 |
| 5,696,889 | A | * | 12/1997 | Morikawa | 358/1.9 |
| 5,734,801 | A | * | 3/1998 | Noguchi et al. | 358/1.9 |
| 6,026,216 | A | * | 2/2000 | Ohtsuka et al. | 358/1.9 |
| 6,320,980 | B1 | * | 11/2001 | Hidaka | 382/167 |
| 6,943,915 | B1 | * | 9/2005 | Teraue | 358/1.9 |
| 2002/0060796 | A1 | * | 5/2002 | Kanno et al. | 358/1.9 |

FOREIGN PATENT DOCUMENTS

| | | |
|---|---|---|
| JP | 07-087349 | 3/1996 |
| JP | 08-212324 | 8/1996 |
| JP | 09-200544 | 7/1997 |

* cited by examiner

METHOD OF AND APPARATUS FOR CORRECTING COLOR OF PRINT MEDIUM, AND PROOFER USED THEREIN

This is a continuation-in-part of application Ser. No. 09/210,392 filed Dec. 14, 1998 (abandoned), the disclosure of which is incorporated herein by reference.

BACKGROUND OF THE INVENTION

1. Field of the Invention

The present invention relates to a method of and an apparatus for correcting the color of a print medium and a proofer such as a color printer or the like, in a proof generating system which generates a color proof comprising a color image printed on a proof sheet with the proofer, before a colored printed material is produced using a print sheet by a color printing machine such as a rotary press or the like.

2. Description of the Related Art

It has heretofore been customary to generate a color proof for examining colors and making color corrections with a proofer such as a color printer or the like before a colored printed material with a color image in the form of a halftone-dot image printed on a print sheet as a final product is produced by a color printing machine.

The proofer is used because it does not require films and printing plates (presensitized plates) to be produced and can easily generate a plurality of hard copies or color proofs within a short period of time.

For forming a color image on a proof sheet, image data depending on a device such as a printing machine, a camera, an image sensor, a CRT, an LED, etc., e.g., C, M, Y, K (cyan, magenta, yellow, black) image data, are converted to calorimetric data independent of a device, e.g., X, Y, Z (stimulus value) data, according to a standard printing profile (a four-dimensional lookup table or the like) given by a printer manufacturer or the like. Then, the device-independent calorimetric data are converted to device-dependent image data for a color printer, e.g., R, G, B (red, green, blue) image data, according to a proofer profile, e.g., a printer profile (a three-dimensional lookup table). Using the device-dependent image data, a color proof with a color image formed on a proof sheet is generated by a color printer which is also referred to as a proof printer. In this manner, the colors of a printed material to be produced by the printing machine can be simulated by the color proof thus generated before the printed material is actually produced.

However, it often happens for the standard printing profile to fail to match printing properties, i.e., printing conditions depending on inks, papers, and printing machine characteristics, of the printing machine which will actually be used to print the color image.

Specifically, the printing conditions vary depending on many parameters which include not only inks, papers, printing machine types, but also production lots and ambient temperatures even when the same inks, paper, and printing machine are used. It is impossible for the standard printing profile to fully match actual printing conditions used by the user, i.e., desired printing conditions. It is therefore necessary to adjust the printing profile according to actual printing conditions, i.e., desired printing conditions, rather than standard printing conditions.

Inks and papers that are in general use are limited to certain types. Therefore, solid ink colors and paper colors are relatively stable even under different printing conditions. However, intermediate color tones may vary greatly depending on conditions in which color images are printed by an actual printing machine. For adjusting such intermediate color tones, it has been the practice to insert one-dimensional lookup tables for the respective colors C, M, Y, K to adjust C, M, Y, K tone curves (also referred to as gradation characteristics or dot gains) prior to the four-dimensional lookup table as the standard printing profile, and convert the respective colors C, M, Y, K to C', M', Y', K', respectively, for color correction.

If the proofer is a CMYK printer capable of using print sheets for finally printing color images thereon, then when such print sheets of the same type and lot as will be used by the actual printing machine are used by the proofer, color images printed on print proofs by the proofer can be confirmed as reflecting finally printed color images substantially exactly.

However, if sheets used by the proofer are of the type for exclusive use by the proofer and are different from print sheets according to the standard printing profile for use by the actual printing machine, then adjustments need to be made because the color of the print sheets themselves does not match the gradation (dot gain) of highlights (lightly tinted areas). Such adjustments can be made to a certain extent by adjusting the tone curves with the one-dimensional lookup tables. However, the sheet color can only be adjusted in principle by increasing the amount of inks. If the sheet color is adjusted, then not only the sheet color, but also the dot gain of lightly tinted areas or highlights is varied, and it is not clear how the dot gain of lightly tinted areas or highlights is to be adjusted.

According to the conventional practice in which proofs are produced by the proofer using dedicated sheets, if the color of print sheets to be used by the actual printing machine is lighter than the color of print sheets according to the standard printing profile, then it is impossible to adjust the dot gain with the sheet color.

SUMMARY OF THE INVENTION

It is therefore an object of the present invention to provide a method of and an apparatus for correcting the color of sheets, more generally, the color of a print medium into a lighter tint, and correcting the color of a print medium, i.e., the difference between the color of a standard print medium and the color of a desired print medium, without affecting the dot gain.

Another object of the present invention is to provide a proofer for generating a color proof having good color reproduction, on a proof print medium having the color different from the color of the desired print medium.

The above and other objects, features and advantages of the present invention will become more apparent from the following description when taken in conjunction with the accompanying drawings in which a preferred embodiments of the present invention is shown by way of illustrative example.

DESCRIPTION OF THE PREFERRED EMBODIMENTS

Figure 1:
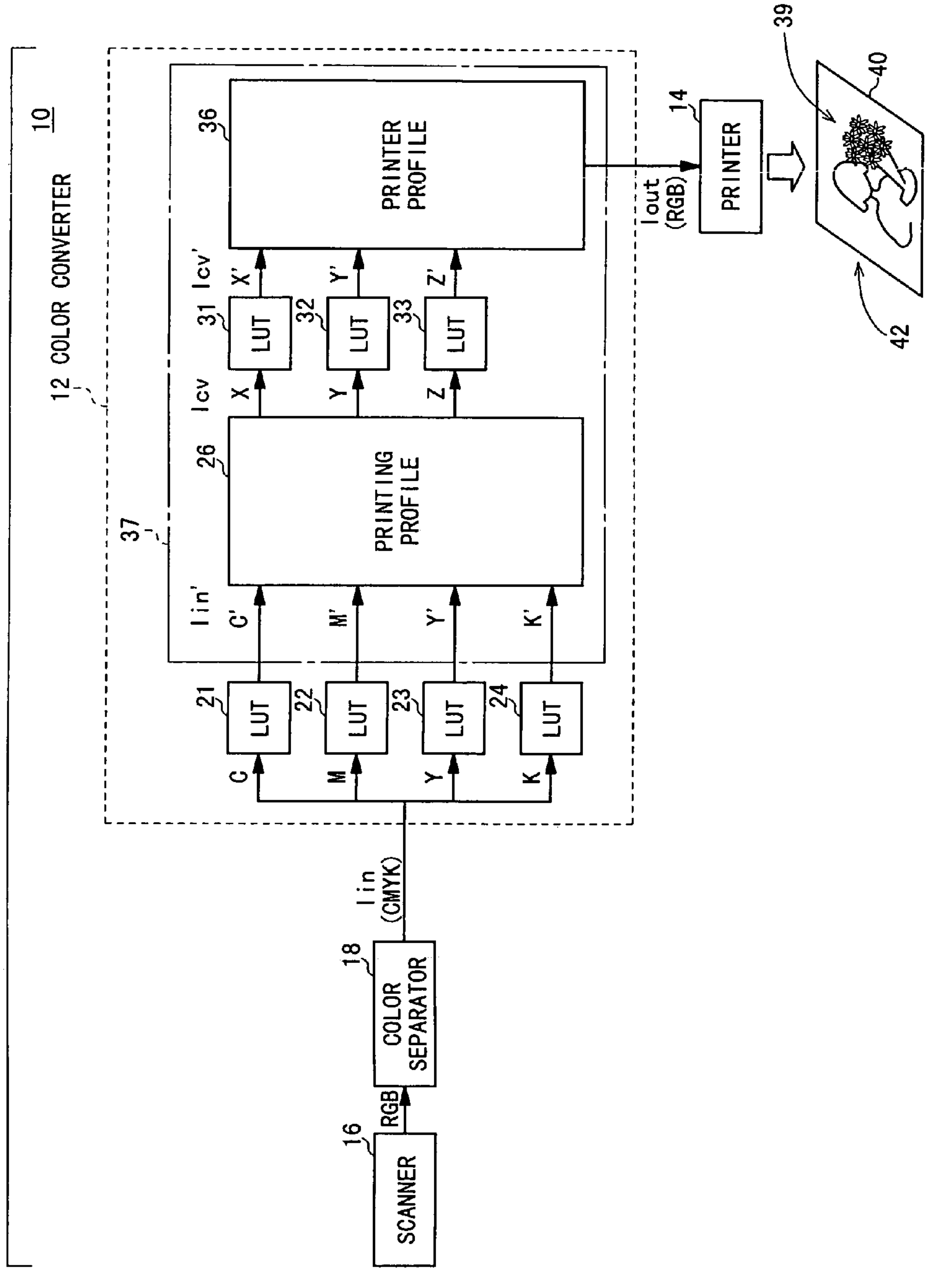
FIG. 1 is a block diagram of a proof generating system to which the principles of the present invention are applied.

As shown in FIG. 1, a proof generating system 10 to which the principles of the present invention are applied has a color converter 12 in the form of a computer. The color converter 12 converts image data depending on an input device, e.g., C, M, Y, K image data Iin=Iin (C, M, Y, K) to be printed, each of halftone-dot % data, to device-dependent image data, e.g., R, G, B image data Iout=Iout (R, G, B), and outputs the R, G, B image data to an image output device as a proofer body, e.g., a printer 14. In this embodiment, the proofer comprises the color converter 12 and the printer 14 as the proofer body.

The C, M, Y, K image data Iin are image data generated by a color separator 18 which converts R, G, B image data generated by an image input device, e.g., a scanner 16, according to a three-color to four-color conversion process (RGB→CMYK) to suit printing properties. The color separator 18 makes known color corrections, gradation corrections, and other corrections, which will not be described in detail below as they do not have a direct bearing on the present invention.

The color converter 12 connected to an output terminal of the color separator 18 has one-dimensional conversion lookup tables (LUTs) 21 through 24 for effecting gradation conversion on each of the colors C, M, Y, K of the C, M, Y, K image data Iin from the color separator 18, and a standard printing profile (given color converting means) 26 for converting gradation-converted image data Iin' (C', M', Y', K') from the LUTs 21 through 24 to X, Y, Z colorimetric data Icv=Icv (X, Y, Z) as first calorimetric data which are device-independent image data.

The color converter 12 also has one-dimensional conversion LUTs (color correcting means, also mentioned as a color adjusting function, a color adjusting block, or a color adjuster) 31 through 33 for effecting colorimetric conversion on the X, Y, Z colorimetric data Icv to second colorimetric data Icv'=Icv' (X', Y', Z').

The color converter 12 further has a printer profile (color converting means) 36 for converting the second colorimetric data Icv' to the R, G, B image data Iout=Iout (R, G, B).

When the R, G, B image data Iout are supplied to the printer 14, the printer 14 generates a proof 42 which carries a color image 39 on a color sheet 40 that is a dedicated proof print medium.

The printer 14 may comprise a laser beam printer which scans the color sheet 40 with R, G, B laser beams intensity-modulated by the R, G, B image data Iout to record latent images, and develops the recorded latent images into visible R, G, B images. The color sheet 40 hereinafter refers to a developed color sheet.

Processes of generating the LUTs 21 through 24 for correcting gradation (dot gain) characteristics, the standard printing profile 26, the calorimetric conversion LUTs 31 through 33, and the printer profile 36 will be described below.

The printer profile 36 is given by a printer manufacturer or the like. For generating the printer profile 36, color patches of combinations of the colors R, G, B of the R, G, B image data Iout, each ranging from a zero value to a maximum value, are produced on the color sheet 40, and measured by a calorimeter to determine X, Y, Z calorimetric data. Then, a conversion table between the R, G, B image data and the X, Y, Z calorimetric data is generated. The generated conversion table is inversely converted and interpolated, if necessary, thereby producing a LUT as the printer profile 36 for converting X, Y, Z calorimetric data (the calorimetric data Icv' in FIG. 1) to R, G, B image data Iout.

The printing profile 26 is also given by a printer manufacturer or the like. The printing profile 26 is a colorimetric table of values of C, M, Y, K halftone-dot % data at certain intervals. For generating a colorimetric table of values of C, M, Y, K halftone-dot % data at intervals of 10%, for example, it is necessary to determine a total of $11^4$=14641 colorimetric values of the four colors C, M, Y, K at 0, 10, . . . , 100 halftone-dot %. Actually, however, several hundred representative colors of these 14641 colorimetric values are printed as a chart on a standard print sheet by a standard printing machine, and then calorimetrically measured to generate a colorimetric table of values of C, M, Y, K halftone-dot % data at intervals of 10% as the standard printing profile 26, which is a nonlinear four-dimensional LUT for converting the image data Iin' (C', M', Y', K') to the colorimetric data Icv (X, Y, Z).

When halftone-dot % data C', M', Y', K' of the image data Iin' (C', M', Y', K') are supplied to the printing profile 26, the printing profile 26 converts the halftone-dot % data C', M', Y', K' to the X, Y, Z colorimetric data Icv=Icv (X, Y, Z) as the first colorimetric data.

As described above, the printing profile 26 requires a very large scale of colorimetric operations to be carried out for making itself highly accurate for color conversion. The printing profile 26 is provided as a standard printing profile by the printer manufacturer. The standard printing profile 26 is designed to cover different papers including art paper, coat paper, mat paper, and wood free paper, two or three types of ink each having a high market share, and a printing machine having a high market share, which is supposed to operate at normal temperature.

The LUTs 21 through 24 for correcting gradation (dot gain) characteristics serve to convert C, M, Y, K halftone-dot % data of the C, M, Y, K image data Iin {Iin=Iin (C, M, Y, K)} to C', M', Y', K' halftone-dot % data of the gradation-converted image data Iin' {Iin' =Iin' (C', M', Y', K')}.

As described above with respect to the related art, since inks and papers that are in general use are limited to certain types, solid ink colors and paper colors are relatively stable even under different printing conditions.

However, intermediate color tones may vary greatly depending on conditions in which color images are printed by an actual printing machine. For adjusting such intermediate color tones, it is necessary to insert one-dimensional C, M, Y, K LUTs 21 through 24 for adjusting C, M, Y, K tone curves (dot gains) prior to the four-dimensional LUT as the standard printing profile 26, and convert the respective colors C, M, Y, K to C', M', Y', K', respectively, for color correction.

For example, if the tone curves (tone curves under desired printing conditions) of a printing machine to be used as the printer 14 to produce the proof 14 are more 15 upwardly convex than the tone curves of the given standard printing profile 26 (which normally agree with a straight line y=x in an orthogonal plane xy at values of 0 and 100%, but are upwardly convex with respect to the straight line y=x in an intermediate section between the values of 0 and 100%), then the LUTs 21 through 24 may incorporate upwardly convex curves to compensate for the difference between the tone curves. Conversely, if the tone curves of a printing machine to be used as the printer 14 are more downwardly convex than the tone curves of the given standard printing profile 26, then the LUTs 21 through 24 may incorporate downwardly convex curves to compensate for the difference between the tone curves.

Even with the corrective one-dimensional tone curves incorporated in the LUTs 21 through 24, if the color of print sheets to be used actually is lighter than the color of print sheets according to the standard printing profile 26 (calorimetric values X, Y, Z outputted from the standard printing profile 26 when the input image data Iin' have values of C'=M'=Y'=K'=0), then the gradations cannot accurately be converted in highlights (tint areas of the intermediate color tones) including the sheet color.

In order to correct the sheet color into a lighter tint, the calorimetric conversion LUTs 31 through 33 are employed. For generating the colorimetric conversion LUTs 31 through 33, the input image data Iin' having values Iin'=0 (C'=M'=Y'=K') are supplied to the printing profile 26, which output X, Y, Z colorimetric values X0, Y0, Z0.

The X, Y, Z colorimetric values X0, Y0, Z0 are then mathematically converted to calorimetric values L*a*b* (hereinafter referred to as calorimetric values of the sheet color according to the printing profile 26) in a CIELAB color space according to a known conversion formula.

Thereafter, each of the calorimetric values L*a*b* of the sheet color according to the printing profile 26 is varied about itself. Specifically, the value of L* relative to luminance is slightly varied about the calorimetric value L*, thereby to calculate values of L*±ΔL, L*±2ΔL. Similarly, the value of a* substantially relative to red is slightly varied about the calorimetric value a*, thereby to calculate values of a*±Δa, a*±2Δa. Furthermore, the value of b* substantially relative to yellow is slightly varied about the colorimetric value b*, thereby to calculate values of b*±Δb, b*±2Δb.

Then, the colorimetric value L* of the sheet color according to the printing profile 26 and the calculated values of L*±ΔL, L*±2ΔL, the calorimetric value a* of the sheet color according to the printing profile 26 and the calculated values of a*±Δa, a*±2Δa, the colorimetric value b* of the sheet color according to the printing profile 26 and the calculated values of b*±Δb, b*±2Δb are converted to colorimetric data X, Y, Z according to a known conversion formula.

The colorimetric data X, Y, Z thus obtained comprise all combinations of the colorimetric values. Combinations about (L*, a*, b*) are 25 combinations including one combination of (L*, a*, b*), two combinations of (L*, a*±Δa, b*), two combinations of (L*, a* ±2Δa, b*), two combinations of (L*, a*, b*±Δb), two combinations of (L*, a*, b*±Δb), four combinations of (L*, a*±Δa, b*±Δb), four combinations of (L*, a*±Δa, b*±2Δb), four combinations of (L*, a*±2Δa, b*±Δb), and four combinations of (L*, a*±2Δa, b*±2Δb). With an exemplary collection of five color charts, there are a total of 125 combinations.

The 125 combinations of Lab data are converted to X, Y, Z data. The converted X, Y, Z data, as the second colorimetric data Icv'=Icv' (X', Y', Z'), are converted to the R, G, B image data Iout {Iout=(R, G, B)} by the printer profile 36. The R, G, B image data Iout are then arrayed in a predetermined sequence, and supplied to the printer 14, which produces a color chart 42A composed of an array of color patch groups 61 through 65. The color chart 42A shows that color patches are arranged in respective cross sections across L*-axes having different L* values (for a*−b* planes) in three-dimensional calorimetric values L*a*b*.

Figure 2:
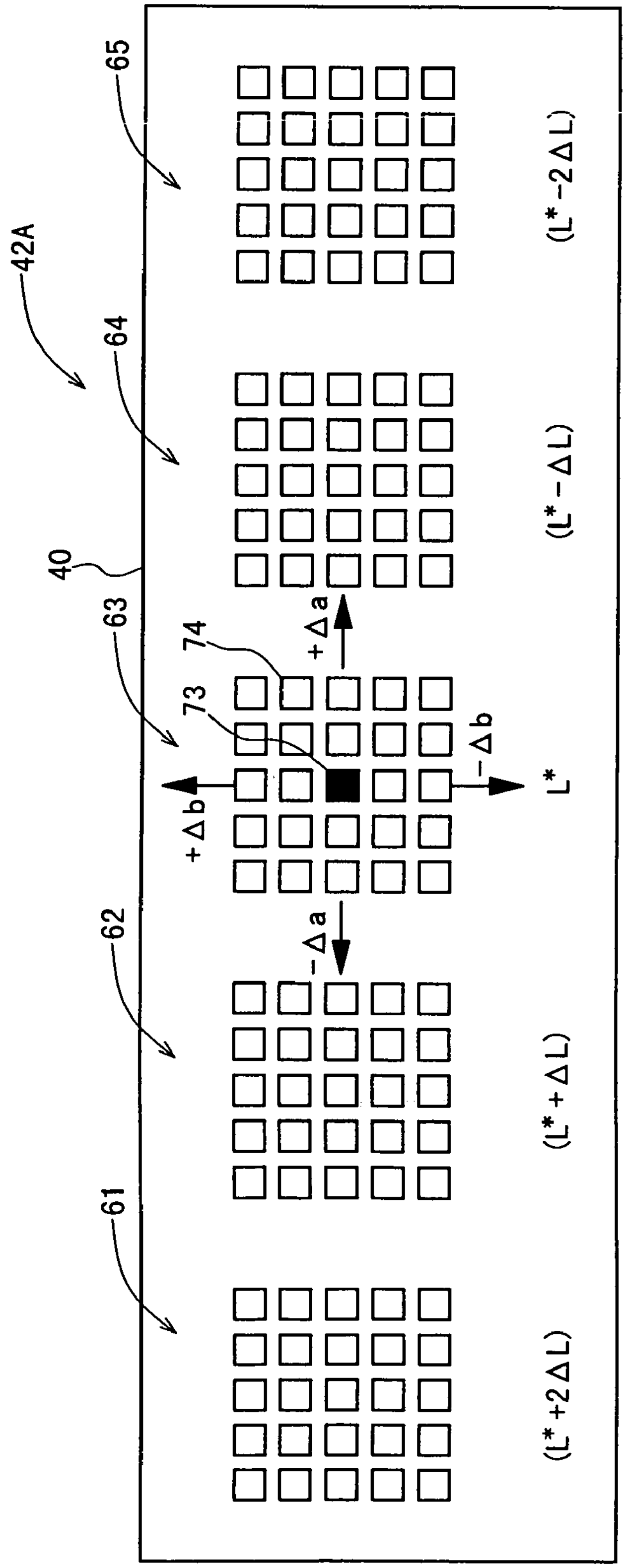
FIG. 2 is a view of a color chart, which is a printed image outputted by a printer, carrying patches that represent colorimetric values L*a*b* of the color of a print sheet to be actually printed and values which vary successively slightly from the colorimetric values L*a*b*.

FIG. 2 schematically shows the color chart 42A. In FIG. 2, the colors of the color patches vary at small intervals of ΔL, Δa, Δb in the CIELAB color space, rather than the CIEXYZ, because they are believed to match human vision characteristics more effectively than the values X, Y, Z.

Figure 3:
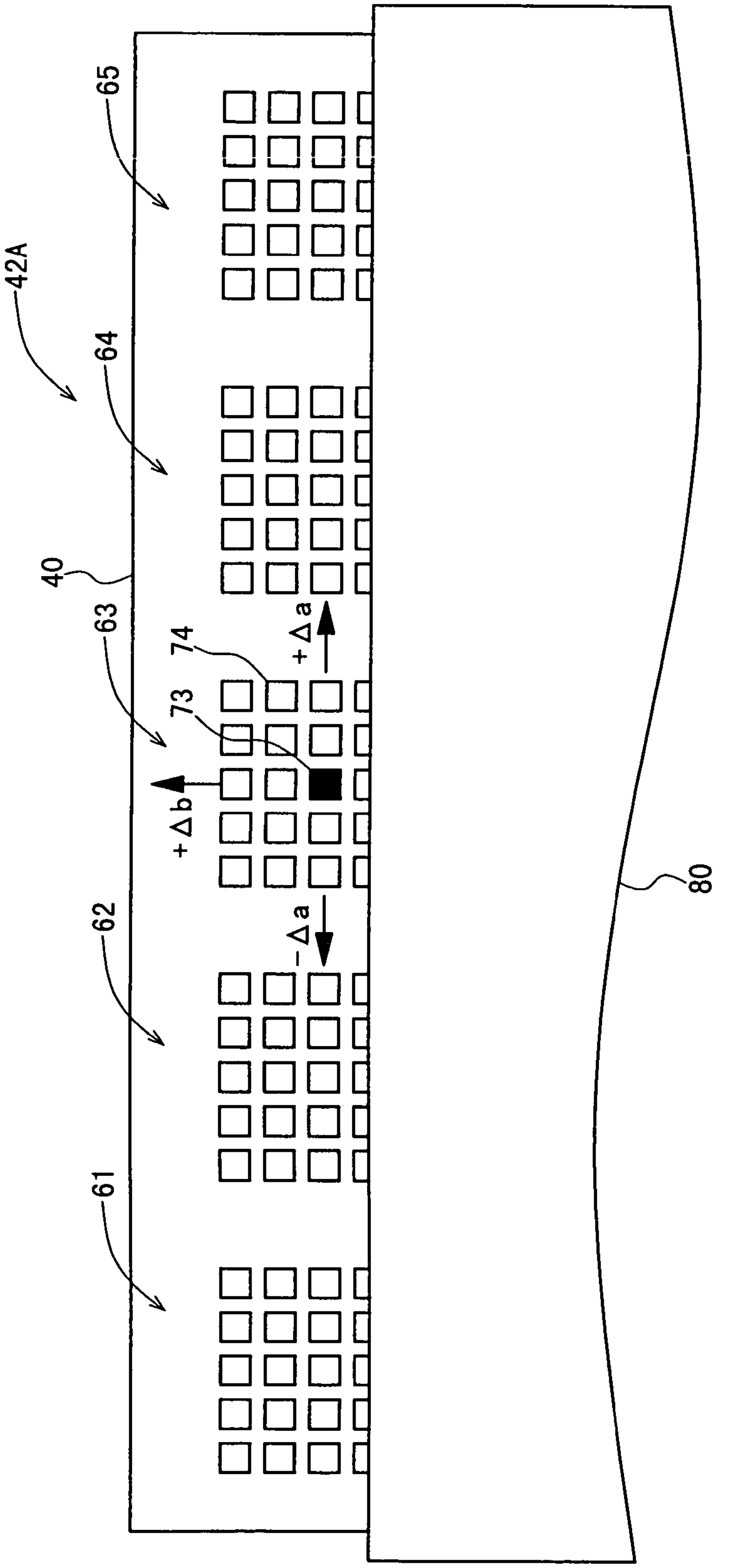
FIG. 3 is a view showing a comparison between the colors of the color patches on the color chart shown in FIG. 2 and the color of a print sheet to be actually printed.

As shown in FIG. 2, the color chart 42A comprises a color sheet 40 carrying the five color patch groups 61 through 65 composed of 5×25=125 color patches. A color patch 73, represented by ■, at the center of the central color path group 63, for example, is formed of the colorimetric values L*a*b* of the sheet color according to the printing profile 26. Color patches positioned on the right of the color patch 73 have colorimetric values incremented by +Δa in the rightward direction. Therefore, a color patch 74, for example, corresponds to calorimetric values (L*, a*+2Δa, b*+Δb). As shown in FIG. 3, a print sheet 80 to be actually used for printing (corresponding to desired printing conditions) is prepared, and partly superposed on the color patches of the color patch groups 61 through 65. The user then visually compares the color of the print sheet 80 and the color patches on the color chart 42A with each other to confirm a color difference.

Inasmuch as the color of the color sheet 40 is lighter than the color of the print sheet 80, it is possible for the user to easily locate a color (color patch) that is substantially the same as the color of the print sheet 80 through a visual observation. When the user spots a color patch whose color cannot be distinguished from the color of the print sheet 80, the colorimetric data of the spotted color patch, stated otherwise, the input values supplied to the printer profile 36 (either of the X, Y, Z data converted from the 125 combinations of the Lab data) are regarded as colorimetric data Xα, Yα, Zα.

If the colorimetric values of the sheet color according to the printing profile 26 are X, Y, Z colorimetric values X0, Y0, Z0 converted from the colorimetric values L*a*b* of the sheet color according to the printing profile 26, then since the X, Y, Z colorimetric values are generally linear, gradients of Xα/X0, Yα/Y0, Zα/Z0 are incorporated in the respective LUTs 31 through 33.

Therefore, the calorimetric data X, for example, supplied to the LUT 31 is converted thereby to calorimetric data X' (=X×Xα/X0), and the calorimetric data Y, Z are also converted thereby to colorimetric data Y' (=Y×Yα/Y0) and Z' (=Z×Zα/Z0). Based on the converted calorimetric data X', Y', Z', the gradation (dot gain) in the vicinity of highlights of the image 39 on the color sheet 40 of the proof 42 produced by the printer 14 can be corrected.

If the user has a colorimeter, then it is not necessary to produce the color chart 42A, but the user may colorimetrically measure the color of the print sheet 80 to be used actually, and use the produced colorimetric data as the above colorimetric data Xα, Yα, Zα.

Figure 4:
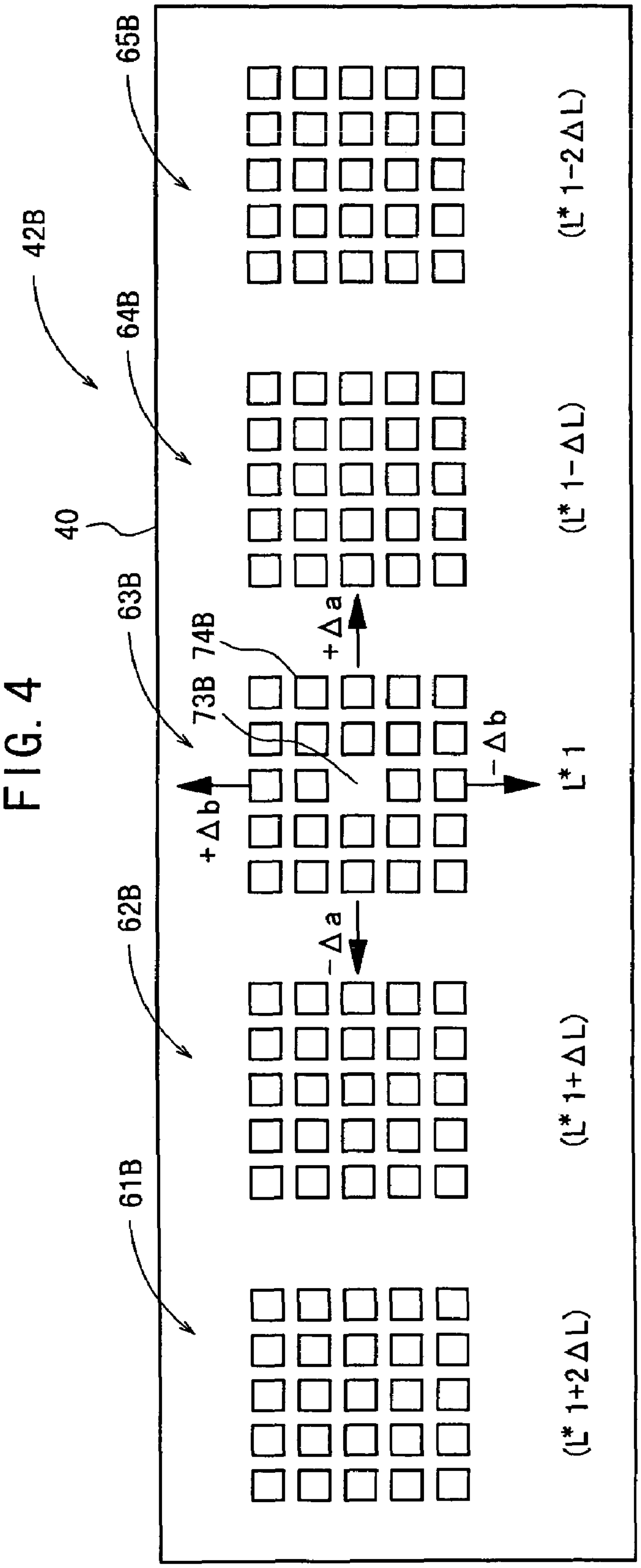
FIG. 4 is a view of a color chart, in which a color of a central color patch in FIG. 2 is same as a color of a color sheet and colors of remaining color patches are changed correspondingly.

As shown in FIG. 4, the color chart 42B may comprise a central color patch 73B having a same color as the one of the color sheet 40 (white color of the background) when the color of the print sheet 80 is determined by partly superposing the print sheet 80 on the color chart. Accordingly, directional relationships of the color changes from the paper color (the color without correction) can be easily understood.

In this case, when colorimetric values of the color paper 40 are assumed as (L*1, a*1, b*1), a color patch 74B, for example, in five color patch groups 61B-65B corresponds to colorimetric values (L*1, a*1+2Δa, b*1+Δb).

Further, when a color difference between two closest color patches (e.g., between a color patch 73 and the eight color patches therearound) is assumed as ΔE in the color chart 42A, the color difference ΔE preferably has a value from 1.5 to 2, for allowing the user to visually distinguish between two closest color patches (also applicable to color patches in color chart 42B).

When outputting color chart 42A or the like in the above embodiment, increment/decrement intervals of calorimetric values L*a*b* are set to be values of ±Δ, ±2Δ with respect to values L*a*b* as values of Δ multiplied by an integral number. However, the increment/decrement intervals may be adjusted or set to be values of ±1.5Δa as values of 66 multiplied by a real number, for example, which are in the range of values between ±Δ and ±2Δ, respectively, for outputting a color chart. The increment/decrement intervals of values L*a*b* can also be set independently with each other, e.g., ±1.5ΔL for the value L*, ±Δa for the value a*, and ±2Δb for the value b*.

According to this embodiment, as described above, the one-dimensional colorimetric conversion LUTs 31 through 33 for adjusting the sheet color are inserted behind the standard printing profile 26. With this arrangement, first, if a calorimeter is available to the user, then the user can directly correct the sheet color based on colorimetric values of the print sheet 80 which are obtained by the calorimeter. Second, the sheet color can be corrected into a tint lighter than the color sheet according to the standard printing profile 26 up to the level of lightness of the color of the color sheet 40. Third, tint areas of the intermediate color tones can appropriately be corrected while keeping the dot gain relationship without having to adjust the tone curves.

The above second and third advantages are independent of each other such that tint areas of the intermediate color tones can appropriately be corrected while keeping the dot gain relationship no matter which direction the sheet color may be varied in.

As described above, the dot gain of the intermediate color tones may be corrected by the one-dimensional C, M, Y, K LUTs 21 through 24 placed in front of the printing profile 26.

In the above embodiment, since the sheet color, the dot gain in tint areas of the intermediate color tones, and the dot gain in other areas of the intermediate color tones can be corrected, the dot gain can be corrected in all areas of the intermediate color tones. Consequently, the sheet color may be corrected to reproduce an image whose colors are accurately representative of those of a printed image, on the color sheet 40.

Therefore, even if the color of a print medium to be used under desired printing conditions is lighter than the color of a print medium used under standard printing conditions, the color can easily be corrected into a lighter color according to calculations without affecting the dot gain.

The principles of the present invention are applicable to a proof generating system for generating a proof with an image output device when a printed material is to be produced using a desired print medium (which may typically be, but not limited to, a sheet of paper) different from a standard print medium (which may typically be, but not limited to, a sheet of paper).

According to the present invention, furthermore, the color converting means given to a standard print medium converts device-dependent image data to first colorimetric data, and the color correcting means for correcting the difference between the color of a desired print medium and the standard print medium converts the first calorimetric data to second colorimetric data. Based on the second calorimetric data, the image output device produces a proof on which the difference between the color of the desired print medium and the standard print medium has been corrected.

Because the color is calorimetrically corrected, a corrective range that is achieved is wide. If the color of the standard print medium produced by the color converting means is different from the color of the desired print medium to be used, e.g., even if the color of the desired print medium is lighter than the color of the standard print medium, the difference between those colors may be corrected.

Before the device-dependent image data are converted to the first colorimetric data by the color converting means, the device-dependent image data are converted in gradation with respect to each color in order to match desired printing conditions for thereby correcting the intermediate color tones, and the sheet color and tints in highlights can be corrected by colorimetric corrections effected by the color converting means.

The color correcting means may be generated by outputting color patches, whose calorimetric values are varied in a colorimetric color space about the color of the standard print medium, on a proof medium with the image output device, and visually comparing the color of the desired print medium with the colors of the color patches on the proof medium.

The color correcting means may alternatively be generated by calorimetrically measuring the color of the desired print medium.

In the color converter 12 of the above embodiment, at least the printing profile 26, the conversion LUTs 31 through 33 for effecting calorimetric conversion, and the printer profile 36 may be combined to be a synthetic LUT (combined LUT) 37 as one synthetic color converting means (combined color converting means). This configuration realizes fast conversion process in the color converter 12.

Although a certain preferred embodiment of the present invention has been shown and described in detail, it should be understood that various changes and modifications may be made therein without departing from the scope of the appended claims.

What is claimed is:

1. A method of correcting the color of a print medium, comprising the steps of:

converting device-dependent image data to first colorimetric data with color converting means given to a standard print medium;

thereafter, converting said first colorimetric data to second colorimetric data with color correcting means to correct the difference between the color of a desired print medium and the color of said standard print medium; and producing a proof on which the difference between the color of said desired print medium and the color of said standard print medium has been corrected, on a proof medium with an image output device based on said second colorimetric data;

wherein said color correcting means comprises one-dimensional lookup tables for converting said first colorimetric data to said second colorimetric data, wherein the converting of the first colorimetric data to second colorimetric data includes a direct conversion between the first and second colorimetric data, and wherein each of the first and second colorimetric data each comprise device-independent color spaces.

2. A method according to claim 1, wherein said color correcting means is generated by outputting color patches, whose colorimetric values are varied in a colorimetric color space about the color of the standard print medium, with said image output device, and comparing the color of the desired print medium with the colors of the color patches on the proof medium.

3. The method of claim 2, wherein a color of a central color patch is the same as a color of the standard print medium.

4. The method of claim 3, wherein the color patches comprise three-dimensional colorimetric values of L*a*b* and color patches are arranged as a*–b* planes in respective cross sections of different L*-axes values.

5. The method of claim 4, wherein each color patch is assigned an integer as a relative position from the central color patch according to each axis of L*a*b* for showing increment/decrement intervals of a colorimetric value and the color of the desired print medium is compared with the color patches, and wherein when no color patch is the same as the color of the desired print medium, a value between two closest color patches which is close to the color of the desired print medium is described as a real number to describe a colorimetric value of the desired print medium.

6. The method of claim 5, wherein a color difference ΔE in adjacent color patches on each axis of L*a*b* has value between 1.5 and 2.0, inclusive.

7. A method according to claim 2, wherein said color patches outputted on said proof medium comprise color patches whose colorimetric values L*a*b* are varied in a CIELAB color space about the color of said standard print medium.

8. The method of claim 1, further comprising outputting a color output based on an output result of the direct conversion between the first and second colorimetric data, and wherein between the direct conversion and the outputting the color output, there is no inclusion of interpolation of the output result of the direct conversion.

9. A method of correcting the color of a print medium, comprising the steps of:

converting device-dependent image data, which have been converted in gradation with respect to each color in order to match desired printing conditions by gradation converting means, to first colorimetric data with color converting means corresponding to standard printing conditions given to a standard print medium;

thereafter, converting said first colorimetric data to second colorimetric data with color correcting means to correct the difference between the color of a desired print medium and the color of said standard print medium; and producing a proof on which the difference between the color of said desired print medium and the color of said standard print medium has been corrected, on a proof medium with an image output device based on said second colorimetric data, wherein the converting of the first colorimetric data to second colorimetric data includes a direct conversion between the first and second colorimetric data, and wherein each of the first and second colorimetric data each comprise device-independent color spaces.

10. A method according to claim 9, wherein said color correcting means is generated by outputting color patches, whose colorimetric values are varied in a colorimetric color space about the color of the standard print medium, with said image output device, and comparing the color of the desired print medium with the colors of the color patches on the proof medium.

11. The method of claim 10, wherein a color of a central color patch is the same as a color of the standard print medium.

12. The method of claim 11, wherein the color patches comprise three-dimensional colorimetric values of L*a*b* and color patches are arranged as a*–b* planes in respective cross sections of different L*-axes values.

13. The method of claim 12, wherein each color patch is assigned an integer as a relative position from the central color patch according to each axis of L*a*b* for showing increment/decrement intervals of a colorimetric value and the color of the desired print medium is compared with the color patches, and wherein when no color patch is the same as the color of the desired print medium, a value between two closest color patches which is close to the color of the desired print medium is described as a real number to describe a colorimetric value of the desired print medium.

14. The method of claim 13, wherein a color difference ΔE in adjacent color patches on each axis of L*a*b* has value between 1.5 and 2.0, inclusive.

15. A method according to claim 10, wherein said color patches outputted on said proof medium comprise color patches whose colorimetric values L*a*b* are varied in a CIELAB color space about the color of said standard print medium.

16. An apparatus for correcting the color of a print medium, comprising:

color converting means given to a standard print medium, for converting device-dependent image data to first colorimetric data;

color correcting means for converting said first colorimetric data to second colorimetric data to correct the difference between the color of a desired print medium and the color of said standard print medium; and an image output device for producing a proof on which the difference between the color of said desired print medium and the color of said standard print medium has been corrected, on a proof medium based on said second colorimetric data;

wherein said color correcting means comprises one-dimensional lookup tables for converting said first colorimetric data to said second colorimetric data, wherein the converting of the first colorimetric data to second colorimetric data includes a direct conversion between the first and second colorimetric data, and wherein each of the first and second colorimetric data each comprise device-independent color spaces.

17. An apparatus according to claim 16, wherein said color correcting means is generated by outputting color patches, whose colorimetric values are varied in a colorimetric color space about the color of the standard print medium, with said image output device, and comparing the color of the desired print medium with the colors of the color patches on the proof medium.

18. An apparatus according to claim 17, wherein said color patches outputted on said proof medium comprise color patches whose colorimetric values L*a*b* are varied in a CIELAB color space about the color of said standard print medium.

19. The apparatus of claim 17, wherein a color of a central color patch is the same as a color of the standard print medium.

20. The apparatus of claim 19, wherein the color patches comprise three-dimensional colorimetric values of L*a*b* and color patches are arranged as a–b* planes in respective cross sections of different L*-axes values.

21. The apparatus of claim 20, wherein each color patch is assigned an integer as a relative position from the central color patch according to each axis of L*a*b* for showing increment/decrement intervals of a colorimetric value and the color of the desired print medium is compared with the color patches, and wherein when no color patch is the same as the color of the desired print medium, a value between two closest color patches which is close to the color of the desired print medium is described as a real number to describe a colorimetric value of the desired print medium.

22. The apparatus of claim 21, wherein a color difference ΔE in adjacent color patches on each axis of L*a*b* has value between 1.5 and 2.0, inclusive.

23. An apparatus for correcting the color of a print medium, comprising:

gradation converting means for converting the gradation of device-dependent image data with respect to each color in order to match desired printing conditions;

color converting means corresponding to standard printing conditions given to a standard print medium, for converting the gradation-converted device-dependent image data to first colorimetric data;

color correcting means for converting said first colorimetric data to second colorimetric data to correct the difference between the color of a desired print medium and the color of said standard print medium; and an image output device for producing a proof on which the difference between the color of said desired print medium and the color of said standard print medium has been corrected, on a proof medium based on said second colorimetric data, wherein the converting of the first colorimetric data to second colorimetric data includes a direct conversion between the first and second colorimetric data, and wherein each of the first and second colorimetric data each comprise device-independent color spaces.

24. An apparatus according to claim 23, wherein said color correcting means is generated by outputting color patches, whose colorimetric values are varied in a colorimetric color space about the color of the standard print medium, with said image output device, and comparing the color of the desired print medium with the colors of the color patches on the proof medium.

25. An apparatus according to claim 24, wherein said color patches outputted on said proof medium comprise color patches whose colorimetric values L*a*b* are varied in a CIELAB color space about the color of said standard print medium.

26. The apparatus of claim 24, wherein a color of a central color patch is the same as a color of the standard print medium.

27. The apparatus of claim 26, wherein the color patches comprise three-dimensional colorimetric values of L*a*b* and color patches are arranged as a*−b* planes in respective cross sections of different L*-axes values.

28. The apparatus of claim 27, wherein each color patch is assigned an integer as a relative position from the central color patch according to each axis of L*a*b* for showing increment/decrement intervals of a colorimetric value and the color of the desired print medium is compared with the color patches, and wherein when no color patch is the same as the color of the desired print medium, a value between two closest color patches which is close to the color of the desired print medium is described as a real number to describe a colorimetric value of the desired print medium.

29. The apparatus of claim 28, wherein a color difference ΔE in adjacent color patches on each axis of L*a*b* has value between 1.5 and 2.0, inclusive.

30. A method of correcting the color of a print medium, comprising the steps of:

converting device-dependent image data to first colorimetric data with color converting means given to a standard print medium;

thereafter, converting said first colorimetric data to second colorimetric data with color correcting means to correct the difference between the color of a desired print medium and the color of said standard print medium; and producing a proof on which the difference between the color of said desired print medium and the color of said standard print medium has been corrected, on a proof medium with an image output device based on said second colorimetric data;

wherein the color correcting means corrects the data based on ratios of $X\alpha/X0$, $Y\alpha/Y0$ and $Z\alpha/Z0$, where $X\alpha$, $Y\alpha$ and $Z\alpha$ are second colorimetric data values and X0, Y0 and Z0 are first colorimetric data values for which the difference between the color of a desired print medium and the color of said standard print medium has been corrected, wherein each of the first and second colorimetric data each comprise device-independent color spaces and the correcting means operates on said device independent color spaces.

31. A method according to claim 30, wherein said color correcting means is generated by outputting color patches, whose colorimetric values are varied in a colorimetric color space about the color of the standard print medium, with said image output device, and comparing the color of the desired print medium with the colors of the color patches on the proof medium.

32. A method according to claim 31, wherein said color patches outputted on said proof medium comprise color patches whose colorimetric values L*a*b* are varied in a CIELAB color space about the color of said standard print medium.

33. The proofer of claim 30, wherein the color of a standard print medium is represented as a first device—independent color space and the color of the desired print medium represents a conversion of data of said first device—independent space.

34. An apparatus for correcting the color of a print medium, comprising:

color converting means given to a standard print medium, for converting device-dependent image data to first colorimetric data;

color correcting means for converting said first colorimetric data to second colorimetric data to correct the difference between the color of a desired print medium and the color of said standard print medium; and an image output device for producing a proof on which the difference between the color of said desired print medium and the color of said standard print medium has been corrected, on a proof medium based on said second colorimetric data;

wherein the color correcting means corrects the data based on ratios of $X\alpha/X0$, $Y\alpha/Y0$ and $Z\alpha/Z0$, where $X\alpha$, $Y\alpha$ and $Z\alpha$ are second colorimetric data values and X0, Y0 and Z0 are first colorimetric data values for which the difference between the color of a desired print medium and the color of said standard print medium has been corrected, wherein each of the first and second colorimetric data each comprise device-independent color spaces and the correcting means operates on said device independent color spaces.

35. An apparatus according to claim 34, wherein said color correcting means is generated by outputting color patches, whose colorimetric values are varied in a colorimetric color space about the color of the standard print medium, with said image output device, and comparing the color of the desired print medium with the colors of the color patches on the proof medium.

36. An apparatus according to claim 35, wherein said color patches outputted on said proof medium comprise color patches whose colorimetric values L*a*b are varied in a CIELAB color space about the color of said standard print medium.

37. A proofer for generating a color proof on a proof print medium having color different from the color of a desired print medium comprising:

a color adjusting device for adjusting the difference between the color of said desired print medium and the color of a standard print medium, wherein the color adjusting device adjusts color proof data based on ratios of $X\alpha/X\mathbf{0}$, $Y\alpha/Y\mathbf{0}$ and $Z\alpha/Z\mathbf{0}$, where $X\alpha$, $Y\alpha$ and $Z\alpha$ are colorimetric data values for producing a proper color on said desired print medium and $X\mathbf{0}$, $Y\mathbf{0}$ and $Z\mathbf{0}$ are colorimetric data values producing the proper color on said standard print medium, and an output device generating the color proof based on an output of the color adjusting device, wherein the colorimetric data values for producing a proper color on said desired print medium and the colorimetric data values for producing the proper color on said standard print medium each comprise device-independent color spaces and the color adjusting device operates on said device independent color spaces.

38. A proofer according to claim 37, wherein said proofer outputs said proof medium having color patches whose colors are varied, and said color adjusting device adjusts color by visually comparing the color of said desired print medium with the colors of said color patches on said proof medium.

39. A proofer according to claim 37, wherein said color adjusting device adjusts color by using a colorimetric data which is determined by colorimetrically measuring the color of said desired print medium with a colorimeter.

40. A proofer according to claim 37, further comprising a printing profile, wherein said color adjusting device adjusts color by a color converting means behind said printing profile.

41. A proofer according to claim 37, further comprising a synthetic color converting means at least combining a printing profile, a color converter for adjusting color, and a printer profile, for correcting color.

* * * * *